United States Patent
Ko et al.

(10) Patent No.: US 7,199,056 B2
(45) Date of Patent: Apr. 3, 2007

(54) LOW COST AND LOW DISHING SLURRY FOR POLYSILICON CMP

(75) Inventors: Sen-Hou Ko, Sunnyvale, CA (US); Kevin H. Song, Gardena, CA (US)

(73) Assignee: Applied Materials, Inc., Santa Clara, CA (US)

(*) Notice: Subject to any disclaimer, the term of this patent is extended or adjusted under 35 U.S.C. 154(b) by 385 days.

(21) Appl. No.: 10/360,388

(22) Filed: Feb. 6, 2003

(65) Prior Publication Data

US 2003/0153189 A1 Aug. 14, 2003

Related U.S. Application Data

(60) Provisional application No. 60/355,033, filed on Feb. 8, 2002.

(51) Int. Cl.
*H01L 21/302* (2006.01)

(52) U.S. Cl. .................. 438/693; 438/692; 257/E21.23

(58) Field of Classification Search ........ 438/690–693, 438/754; 451/41; 51/309; 510/175; 216/99
See application file for complete search history.

(56) References Cited

U.S. PATENT DOCUMENTS

| | | | |
|---|---|---|---|
| 4,169,337 A | 10/1979 | Payne | |
| 4,588,421 A | 5/1986 | Payne | |
| 4,752,628 A | 6/1988 | Payne | |
| 4,867,757 A * | 9/1989 | Payne | 51/293 |
| 5,152,917 A | 10/1992 | Pieper et al. | |
| 5,244,534 A | 9/1993 | Yu et al. | 156/636 |
| 5,264,010 A * | 11/1993 | Brancaleoni et al. | 51/308 |
| 5,342,419 A | 8/1994 | Hibbard | |
| 5,368,619 A | 11/1994 | Culler | |
| 5,378,251 A | 1/1995 | Culler et al. | |
| 5,391,258 A * | 2/1995 | Brancaleoni et al. | 216/89 |
| 5,395,801 A | 3/1995 | Doan et al. | 437/225 |
| 5,445,996 A * | 8/1995 | Kodera et al. | 438/633 |
| 5,453,312 A | 9/1995 | Haas et al. | |
| 5,614,444 A | 3/1997 | Farkas et al. | |
| 5,692,950 A | 12/1997 | Rutherford et al. | |
| 5,738,574 A | 4/1998 | Tolles et al. | 451/288 |
| 5,738,800 A | 4/1998 | Hosali et al. | |
| 5,759,917 A * | 6/1998 | Grover et al. | 438/690 |
| 5,769,689 A | 6/1998 | Cossaboon et al. | |
| 5,770,095 A | 6/1998 | Sasaki et al. | |

(Continued)

FOREIGN PATENT DOCUMENTS

EP 1 068 928 A2 1/2000

(Continued)

OTHER PUBLICATIONS

PCT Search Report for US 02/22587 dated Apr. 14, 2003.

(Continued)

*Primary Examiner*—David A. Zarneke
(74) *Attorney, Agent, or Firm*—Patterson and Sheridan

(57) ABSTRACT

Methods and compositions are provided for planarizing substrate surfaces with low dishing. Aspects of the invention provide methods of using compositions comprising an abrasive selected from the group consisting of alumina and ceria and a surfactant for chemical mechanical planarization of substrates to remove polysilicon.

22 Claims, 3 Drawing Sheets

U.S. PATENT DOCUMENTS

| | | | |
|---|---|---|---|
| 5,804,507 A | 9/1998 | Perlov et al. | |
| 5,817,567 A | 10/1998 | Jang et al. | |
| 5,922,620 A | 7/1999 | Shimomura et al. | |
| 5,932,486 A | 8/1999 | Cook et al. | |
| 5,951,724 A | 9/1999 | Hanawa et al. | |
| 5,958,794 A | 9/1999 | Bruxvoort et al. | |
| 5,968,239 A | 10/1999 | Miyashita et al. | |
| 5,981,394 A | 11/1999 | Ohashi et al. | 438/692 |
| 5,981,396 A | 11/1999 | Robinson et al. | |
| 5,990,012 A * | 11/1999 | Robinson et al. | 438/692 |
| 6,019,806 A | 2/2000 | Sees et al. | 51/308 |
| 6,042,741 A * | 3/2000 | Hosali et al. | 252/79.1 |
| 6,043,155 A | 3/2000 | Homma et al. | |
| 6,046,112 A | 4/2000 | Wang | |
| 6,054,379 A | 4/2000 | Yau et al. | |
| 6,060,395 A | 5/2000 | Skrovan et al. | |
| 6,063,306 A | 5/2000 | Kaufman et al. | |
| 6,099,604 A | 8/2000 | Sandhu et al. | |
| 6,114,249 A | 9/2000 | Canaperi et al. | 438/692 |
| 6,136,218 A | 10/2000 | Skrovan et al. | |
| 6,143,663 A | 11/2000 | Koutny, Jr. | |
| 6,149,830 A | 11/2000 | Lin et al. | |
| 6,162,368 A | 12/2000 | Li et al. | |
| 6,183,354 B1 | 2/2001 | Zuniga et al. | 451/285 |
| 6,193,790 B1 | 2/2001 | Tani | |
| 6,206,756 B1 | 3/2001 | Chopra et al. | |
| 6,221,118 B1 | 4/2001 | Yoshida et al. | |
| 6,234,875 B1 | 5/2001 | Pendergrass, Jr. | |
| 6,258,721 B1 | 7/2001 | Li et al. | |
| 6,273,786 B1 | 8/2001 | Chopra et al. | |
| 6,276,996 B1 | 8/2001 | Chopra | |
| 6,290,580 B1 | 9/2001 | Tanaka et al. | |
| 6,294,105 B1 | 9/2001 | Feeney et al. | 252/79.1 |
| 6,316,366 B1 | 11/2001 | Kaufman et al. | 438/693 |
| 6,391,792 B1 * | 5/2002 | Jang et al. | 438/734 |
| 6,435,942 B1 | 8/2002 | Jin et al. | 451/8 |
| 6,436,834 B1 * | 8/2002 | Lee et al. | 438/693 |
| 6,468,910 B1 | 10/2002 | Srinivasan et al. | 438/692 |
| 6,491,843 B1 | 12/2002 | Srinivasan et al. | |
| 6,533,832 B2 * | 3/2003 | Steckenrider et al. | 51/308 |
| 6,540,935 B2 * | 4/2003 | Lee et al. | 252/79.1 |
| 6,544,892 B2 | 4/2003 | Srinivasan et al. | |
| 6,558,236 B2 | 5/2003 | Donohue et al. | |
| 6,607,967 B1 * | 8/2003 | Pallinti et al. | 438/411 |
| 6,626,968 B2 * | 9/2003 | Park et al. | 51/309 |
| 2001/0036738 A1 | 11/2001 | Hatanaka et al. | 438/693 |
| 2003/0036339 A1 | 2/2003 | Bonner et al. | 451/41 |
| 2003/0040182 A1 | 2/2003 | Hsu et al. | 438/692 |
| 2003/0176151 A1 | 9/2003 | Tam et al. | |

FOREIGN PATENT DOCUMENTS

| | | |
|---|---|---|
| EP | 1 061 111 A1 | 12/2000 |
| JP | 2000156360 | 6/1999 |
| JP | 2000068371 | 3/2000 |
| WO | 98/49723 | 11/1998 |
| WO | 99 46081 | 9/1999 |
| WO | 00 02235 | 1/2000 |
| WO | 00/30159 | 5/2000 |
| WO | 00/36037 | 6/2000 |
| WO | 00/49647 | 8/2000 |
| WO | 00/56391 | 9/2000 |

OTHER PUBLICATIONS

Gagliardi et al., "3M SlurryFree™ CMP Fixed Abrasives for Direct HDP STI CMP", Technical Brief, Jun. 2001.

US 6,204,181, 03/2001, Molnar (withdrawn)

* cited by examiner

LOW COST AND LOW DISHING SLURRY FOR POLYSILICON CMP

CROSS-REFERENCE TO RELATED APPLICATIONS

This application claims benefit of U.S. provisional patent application Ser. No. 60/355,033, filed Feb. 8, 2002, entitled "Low Cost and Low Dishing Slurry for Polysilicon CMP," which is herein incorporated by reference.

BACKGROUND OF THE INVENTION

1. Field of the Invention

The present invention generally relates to the fabrication of semiconductor devices and to polishing and planarizing substrates.

2. Background of the Related Art

Reliably producing sub-quarter micron and smaller features is one of the key technologies for the next generation of very large scale integration (VLSI) and ultra large-scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias, contacts, lines, and other interconnects. Reliable formation of these interconnects is important to VLSI and ULSI success and to the continued effort to increase circuit density and quality of individual substrates and die.

Multilevel interconnects are formed by the sequential deposition and removal of materials from the substrate surface to form features therein. As layers of materials are sequentially deposited and removed, the uppermost surface of the substrate may become non-planar across its surface and require planarization prior to further processing. Planarizing a surface, or "polishing" a surface, is a process where material is removed from the surface of the substrate to form a generally even, planar surface. Planarization is useful in removing excess deposited material and removing undesired surface topography and surface defects, such as rough surfaces, agglomerated materials, crystal lattice damage, scratches, and contaminated layers or materials to provide an even surface for subsequent processing.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing media in a CMP apparatus. The carrier assembly provides a controllable pressure to the substrate urging the substrate against the polishing media. The substrate and polishing media are moved in a relative motion to one another.

A polishing composition is provided to the polishing media to effect chemical activity in removing material from the substrate surface. The polishing composition may contain abrasive material to enhance the mechanical activity between the substrate and polishing media. Thus, the CMP apparatus effects polishing or rubbing movement between the surface of the substrate and the polishing media while dispersing a polishing composition to effect both chemical activity and mechanical activity. The chemical and mechanical activity removes excess deposited materials and planarizes a substrate surface.

Chemical mechanical polishing may be used in the fabrication of shallow trench isolation (STI) structures. STI structures may be used to separate transistors and components of a transistor, such as source/drain junctions or channel stops, on a substrate surface during fabrication. STI structures can be formed by depositing a series of dielectric materials and polishing the substrate surface to remove excess or undesired dielectric materials. An example of a STI structure fabrication sequence includes depositing a silicon nitride layer on an oxide layer formed on a doped silicon substrate surface, patterning and etching the substrate surface to form a feature definition, depositing a silicon oxide fill of the feature definitions, and polishing the substrate surface to remove excess silicon oxide to form a feature. The silicon nitride layer may perform as a hard mask during etching of the features in the substrate and/or as a polishing stop during subsequent polishing processes. Such STI fabrication processes require polishing the silicon oxide layer to the silicon nitride layer with a minimal amount of silicon nitride removed during the polishing process in order to prevent damaging of the underlying materials, such as oxide and doped silicon.

The STI substrate is typically polished using a conventional polishing media and an abrasive containing polishing slurry. However, polishing STI substrates with conventional polishing media and abrasive containing polishing slurries has been observed to result in overpolishing of the substrate surface or the formation of recesses in the STI features and other topographical defects such as microscratches on the substrate surface. This phenomenon of overpolishing and forming recesses in the STI features is referred to as dishing. Dishing is also used to refer to overpolishing and forming recesses in other types of features. Dishing is highly undesirable because dishing of substrate features may detrimentally affect device fabrication by causing failure of isolation of transistors and transistor components from one another, resulting in short-circuits. Additionally, overpolishing of the substrate may also result in oxide loss and exposure of the underlying oxide to damage from polishing or chemical activity, which detrimentally affects device quality and performance.

Dishing is particularly likely to occur during the polishing of a substrate having a non-uniform distribution of features on the substrate surface or during the polishing of a substrate having wide features, e.g. about 100 μm. An example of a type of substrate, e.g., a STI substrate, that has a non-uniform distribution of features is a polysilicon substrate having storage cells and capacitor plates of flash memory devices for sub 0.18 μm technology, as shown in FIG. 1. The substrate 10 comprises a layer of polysilicon 12 formed over oxide components 14. The region 13 of the substrate 10 above the oxide components 14 is referred to as the field. Typically, the field is higher than the region 15 of the substrate 10 above the trenches 22 between the oxide components 14. The array 18 of the storage or memory cells has a high density of features and the area 16 of the capacitor plates has a low density of features. When conventional polysilicon CMP is performed on such a substrate, the removal rate of material from the substrate surface in the high density area is lower than the removal rate in the low density area. In order to planarize the substrate surface in the high density area, the substrate must be polished to an extent that results in overpolishing, and thus, dishing, in the low density area. An example of a polysilicon substrate that has experienced dishing from CMP is shown in FIG. 2. The line 20 shows the amount of dishing experienced in a trench 22 of the substrate. Thus, dishing may also be described as the removal of too much material, such as polysilicon, from the region of the substrate above the trenches in the substrate.

Therefore, there exists a need for a method and a CMP composition which facilitates the removal of polysilicon from a substrate with minimal or reduced dishing. In particular, there exists a need for a method and a CMP composition which facilitates the removal of polysilicon from a substrate having a non-uniform density of features and/or large feature sizes.

SUMMARY OF THE INVENTION

Embodiments of the present invention generally provide a method and composition for planarizing a substrate surface with low dishing. In one aspect, an embodiment is a method of processing a substrate, comprising polishing a substrate having a polysilicon layer disposed on an oxide layer, the oxide layer defining trenches in the substrate and field areas on the substrate, with a polishing composition, the polishing composition comprising a polymeric surfactant and an abrasive selected from the group consisting of alumina and ceria. Preferably, polysilicon is removed from the fields at a higher removal rate than from the trenches. In one or more embodiments, the substrate is exposed to a pressure of from about 2 to about 4 psi while the substrate is contacted with the polishing composition. An example of a polymeric surfactant that may be used is a polycarboxylate surfactant. In one or more embodiments, the composition may further comprise an oxidizing agent. For example, the composition may further comprise an oxidizing agent such as hydrogen peroxide. In one embodiment, the polysilicon and the oxide are removed at a removal rate ratio of the polysilicon to the oxide of about 2:1.

In another aspect, the invention provides a composition for polysilicon chemical mechanical polishing, comprising an abrasive selected from the group consisting of alumina and ceria and a polymeric surfactant. In one embodiment, the polymeric surfactant can be a polycarboxylate surfactant. In one embodiment, the composition may further comprise an oxidizing agent. In one embodiment, the oxidizing agent is hydrogen peroxide.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The words and phrases used herein should be given their ordinary and customary meaning in the art by one skilled in the art unless otherwise further defined. Polishing should be broadly construed and includes, but is not limited to, removing material from a substrate by the application of chemical activity, mechanical activity, or a combination of both chemical and mechanical activity to remove material from a substrate surface.

The present invention generally provides a method and composition for planarizing a substrate surface with selective removal rates and low dishing. The invention will be described below in reference to a planarizing process for the removal of polysilicon and/or amorphous silicon, from a substrate surface by a chemical mechanical polishing (CMP) technique. Chemical-mechanical polishing is broadly defined herein as polishing a substrate by a combination of chemical activity, mechanical activity, and/or mechanical activity.

The invention will be described below in reference to a planarizing process and composition that can be carried out using chemical mechanical polishing process equipment, such as the Mirra® Chemical Mechanical Polisher, manufactured by Applied Materials, Inc., located in Santa Clara, Calif. Other polishing modules may also be used to advantage. For example, the Reflexion® CMP System including a cleaner and available from Applied Materials, Inc., of Santa Clara, Calif., may also be used.

Figure 1:
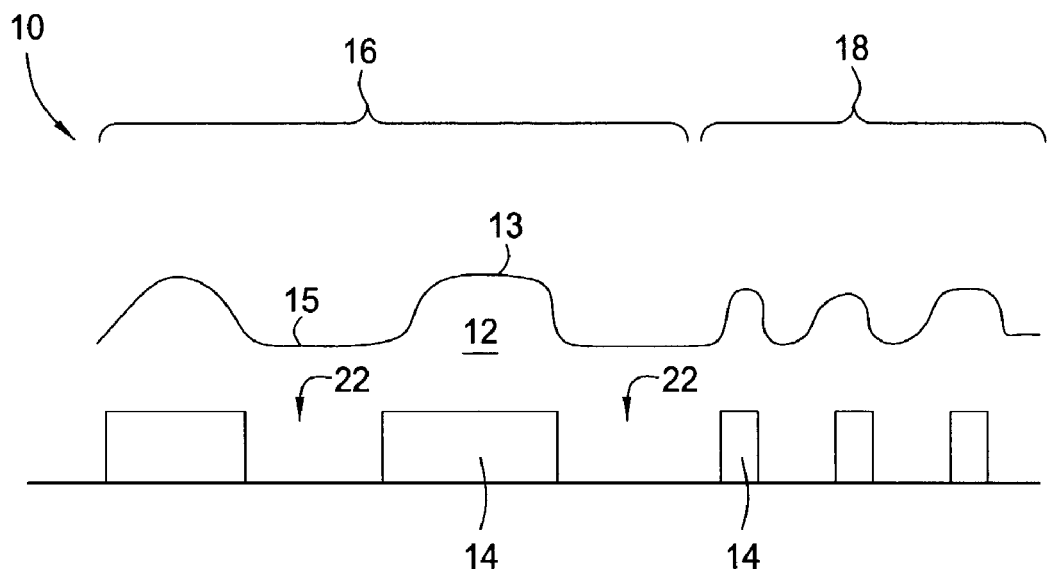
FIG. 1 is a cross sectional view of a substrate having polysilicon formed thereon.
Figure 2:
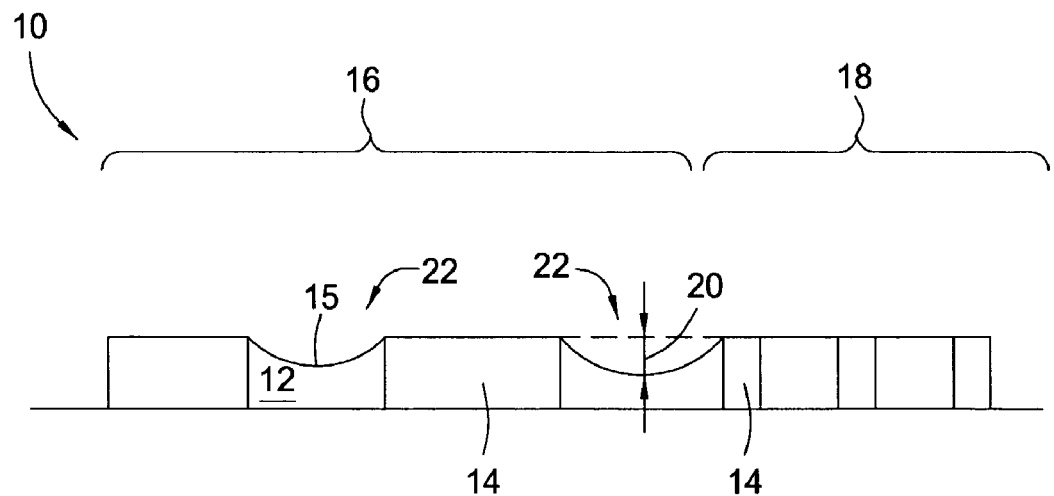
FIG. 2 is a cross sectional view of a substrate illustrating dishing as a result of CMP.
Figure 3:
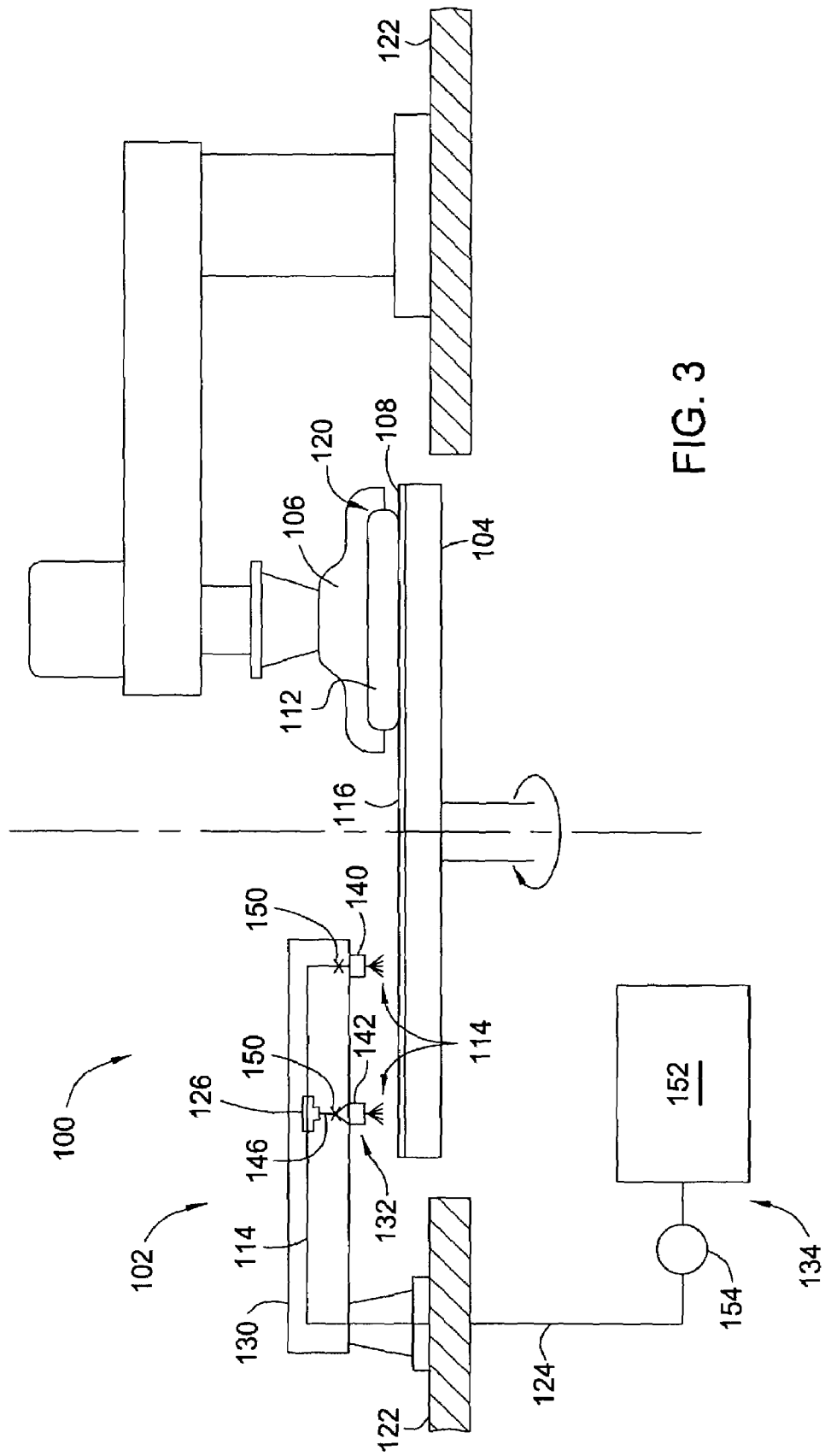
FIG. 3 is a simplified schematic of a polishing system.

FIG. 3 depicts one embodiment of a polishing system 100 for polishing a substrate 112 having a polishing fluid delivery system 102 that controls the distribution of polishing composition 114 across a polishing material 108. Examples of polishing systems which may be adapted to benefit from aspects of the invention are disclosed in U.S. patent application Ser. No. 09/144,456, filed Feb. 4, 1999 by Birang, et al. and U.S. Pat. No. 5,738,574, issued Apr. 14, 1998 to Tolles, et al., both of which are hereby incorporated by reference in their entirety. Other polishing fluid delivery systems or means may be used to deliver the polishing compositions described herein to a chemical mechanical polishing system.

Generally, the exemplary polishing system 100 includes a platen 104 and a polishing head 106. The platen 104 is generally positioned below the polishing head 106 that holds the substrate 112 during polishing. The platen 104 is generally disposed on a base 122 of the system 100 and coupled to a motor (not shown). The motor rotates the platen 104 to provide at least a portion of a relative polishing motion between the polishing material 108 disposed on the platen 104 and the substrate 112. It is understood that relative motion between the substrate 112 and the polishing material 108 may be provided in other manners. For example, at least a portion of the relative motion between the substrate 112 and polishing material 108 may be provided by moving the polishing head 106 over a stationary platen 104, moving the polishing material linearly under the substrate 112, moving both the polishing material 108 and the polishing head 106 and the like.

The polishing material 108 is generally supported by the platen 104 so that a polishing surface 116 faces upward towards the polishing head 106. Typically, the polishing material 108 is fixed to the platen 104 by adhesives, vacuums, mechanical clamping or the like during processing. Optionally, and particularly in applications where the polishing material 108 is configured as a web, the polishing material 108 is releasably fixed to the platen 104, typically by use of a vacuum disposed between the polishing material 108 and platen 104 as described in the previously incorporated U.S. patent application Ser. No. 09/144,456.

The polishing material 108 may be a conventional material. Conventional polishing material 108 is generally comprised of a foamed polymer and disposed on the platen 104 as a pad. In one embodiment, the conventional polishing material 108 is a foamed polyurethane. Preferably, the pad comprises polyurethane. In a preferred embodiment, the pad is an IC1010 polyurethane pad, available from Rodel Inc., of Newark, Del. IC1010 polyurethane pads typically have a thickness of about 2.05 mm and a compressability of about 2.01%. Other pads that can be used include IC1000 pads with and without an additional compressible bottom layer underneath the IC1000 pad and IC1010 pads with an additional compressible bottom layer underneath the IC1010 pad. The compositions described herein are placed on the pad to contribute to the chemical mechanical polishing of substrate.

The polishing head 106 generally is supported above the platen 104. The polishing head 106 retains the substrate 112 in a recess 120 that faces the polishing surface 116. The polishing head 106 typically moves toward the platen 104 and presses the substrate 112 against the polishing material 108 during processing. The polishing head 106 may be stationary or rotate, isolate, move orbitally, linearly or a combination of motions while pressing the substrate 112 against the polishing material 108. One example of a polishing head 106 that may be adapted to benefit from the invention is described in U.S. Pat. No. 6,183,354 B1, issued Feb. 6, 2001 to Zuniga et al., and is hereby incorporated by reference in its entirety. Another example of a polishing head 106 that may be adapted to benefit from the invention is a TITAN HEAD™ wafer carrier, available from Applied Materials, Inc., of Santa Clara, Calif.

The polishing fluid delivery system 102 generally comprises a delivery arm 130, a plurality of nozzles 132 disposed on the arm 130 and at least one polishing fluid source 134. The delivery arm 130 is configured to meter polishing composition 114 at different flow rates along the arm 130 to control the distribution of polishing composition 114 on the polishing surface 116 of the polishing material 108. As the polishing composition 114 is generally supplied from a single source, the polishing composition 114 is disposed on the polishing material 108 in a uniform concentration but in varying amounts along the width (or diameter) of the polishing material 108.

The delivery arm 130 is generally coupled to the base 122 proximate the platen 104. The plurality of nozzles 132 are disposed along a portion of the delivery arm 130 which is disposed above the platen 104. In one embodiment, the nozzles 132 comprise at least a first nozzle 140 and a second nozzle 142. Typically, the first nozzle 140 is positioned on the arm 130 radially inward of the second nozzle 142 relative to the center of rotation of the polishing material 108. The distribution of polishing composition 114 across the polishing material 108 is controlled by flowing polishing composition 114 from the first nozzle 140 at a rate different than the flow from the second nozzle 142.

The flow rates exiting the first and second nozzles 140, 142 are generally different from one another. The flow rates may be fixed relative to each other or controllable. In one embodiment, the fluid delivery arm 130 includes a polishing fluid supply line 124 that is teed between the first and second nozzles 140, 142. A tee fitting 126 is coupled to the supply line 124 and has a first delivery line 144 and a second delivery line 146 branching therefrom that are coupled respectively to the nozzles 140, 142.

At least one of the nozzles 132 contains a flow control mechanism 150. The flow control mechanism 150 may be a device which provides a fixed ratio of flow between the nozzles 140, 142 or the flow control mechanism 150 may be adjustable to provide dynamic control of the flow rates. Examples of flow control mechanisms 150 include fixed orifices, pinch valves, proportional valves, restrictors, needle valves, restrictors, metering pumps, mass flow controllers and the like. Alternatively, the flow control mechanism 150 may be provided by a difference in the relative pressure drop between the fluid delivery lines 144, 146 coupling each nozzle 140, 142 and the tee fitting 126.

The polishing fluid source 134 is typically disposed externally to the system 100. In one embodiment, the polishing fluid source 134 generally includes a reservoir 152 and a pump 154. The pump 154 generally pumps the polishing fluid 114 from the reservoir 152 through the supply line 124 to the nozzles 132.

In operation, the substrate 112 is positioned in polishing head 106 and brought in contact and polished with the polishing material 108 supported by the rotating platen 104. The polishing head 106 may hold the substrate stationary, or may rotate or otherwise move the substrate to augment the relative motion between the polishing material 108 and substrate 112. The polishing fluid delivery system 102 flows the polishing composition 114 through the supply line 124 to the first and second polishing nozzles 140, 142.

Chemical Mechanical Polishing Process and Composition

Planarizing processes and compositions are provided to modify the removal rates of polysilicon materials and to polish polysilicon with abrasives and surfactant additives to reduce dishing and reduce loss of adjacent layers.

Figure 4:
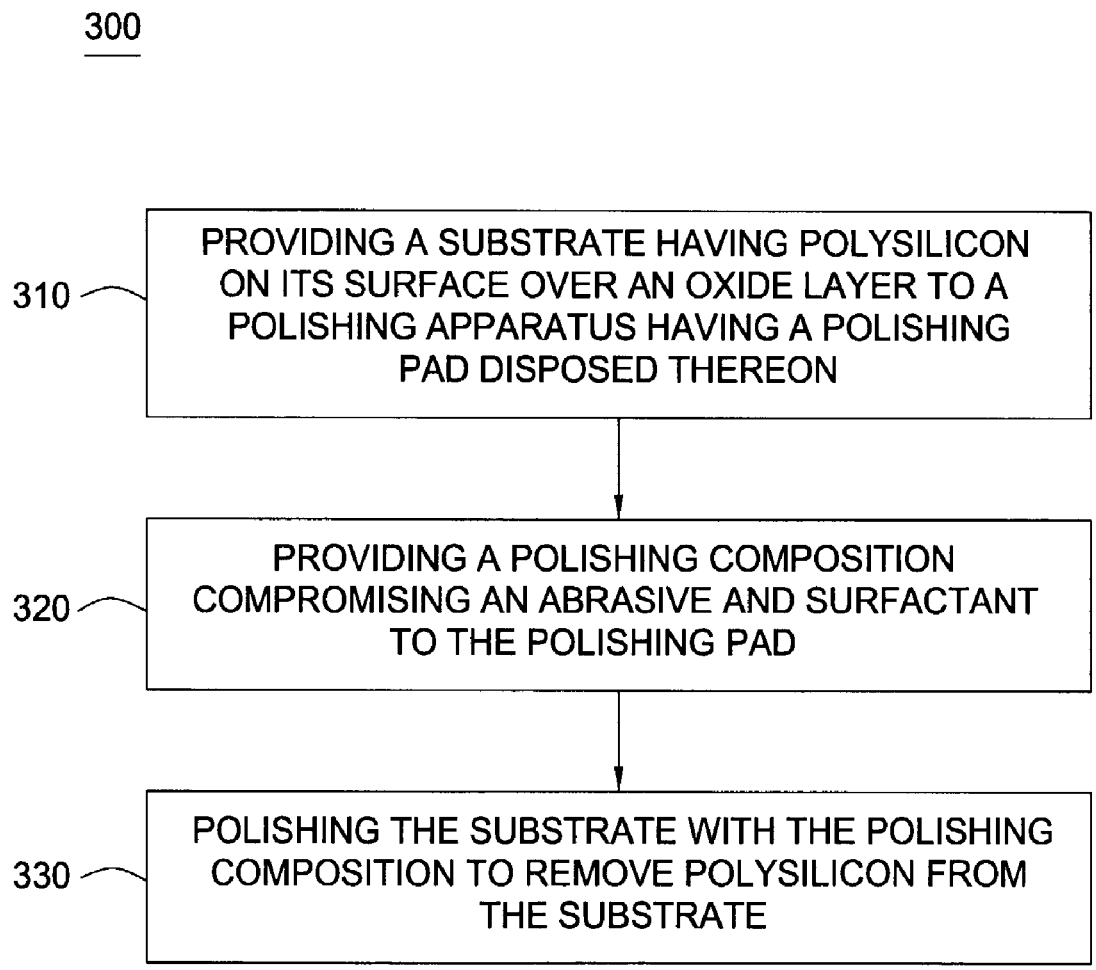
FIG. 4 is a flow chart illustrating the processing steps according to one embodiment of the invention.

FIG. 4 is a flow chart illustrating one embodiment of a process for planarizing a substrate surface. A method 300 of planarizing a substrate surface using a polishing composition comprising an abrasive and a surfactant is provided as follows. A substrate having polysilicon on its surface over an oxide layer is provided to a polishing apparatus having a polishing pad disposed thereon at Step 310. Preferably, the oxide layer defines trenches in the substrate and field areas on the substrate. In one embodiment, the substrate is an STI substrate. A polishing composition comprising an abrasive and a surfactant is delivered to the polishing pad disposed on the polishing apparatus at Step 320. The substrate is polished with the polishing composition to remove polysilicon from the substrate at Step 330. Preferably, the polysilicon is removed from the fields of the substrate at a higher removal rate than from the trenches of the substrate.

The substrate is positioned on a polishing platen containing the polishing pad disposed thereon at step 310. The substrate that may be polished by the process described herein may include polysilicon-containing storage cells and capacitor plates of flash memory devices.

The composition comprising an abrasive and a surfactant is delivered to the polishing pad at Step 320. In one or more embodiments, the polishing composition comprises a polymeric surfactant and an abrasive selected from the group consisting of alumina and ceria. Preferably, in any or all of the embodiments of the composition described herein, the polymeric surfactant is or includes a polycarboxylate surfactant, i.e., a surfactant comprising polycarboxylates. Examples of preferred polycarboxylate surfactants include Hitachi HS-8103GPE and Hitachi HS-8102GP, both of which are available from Hitachi, Ltd., of Tokyo, Japan. HS-8103GPE comprises approximately 3 wt % carboxylates and HS-8102GP comprises approximately 2 wt % carboxylates. Examples of preferred abrasives include alumina and Hitachi HS-8005. Hitachi HS-8005 is a material comprising ceria, and is available from Hitachi Ltd, of Tokyo, Japan. Preferably, Hitachi HS-8005 comprises about 5% ceria in deionized water.

It is believed that the surfactants contribute to the polishing process by preventing the aggregation of the material used as an abrasive. In conventional CMP polishing compositions, abrasive particles may frequently aggregate, and thus do not provide a uniform polishing composition, and thus, do not provide a uniform polishing process. In particular, aggregation of alumina particles has been observed in conventional CMP polishing compositions. Using the compositions described herein, aggregation of alumina is typically minimized, and thus, alumina can be used as an abrasive rather than ceria, which is generally many times more expensive than alumina. However, ceria may be used in the compositions provided herein.

It is believed that the compositions described herein unexpectedly have different chemical and/or physical properties on the fields compared to the trenches of a substrate during CMP. For example, it is believed that in the trenches, the polymeric surfactant holds or confines the abrasives in the polishing composition such that the chemical and mechanical polishing of the substrate is minimized in the trenches. However, it is believed that on the fields, the surfactant does not prevent the chemical and mechanical polishing of the substrate.

In one embodiment, the polishing composition comprises from about 0.5 to about 5.0% ceria and from about 1 to about 2.5% polymeric surfactant. The polishing composition may also include deionized water. In one embodiment, the polishing composition comprises from about 1% ceria and about 1.6% polymeric surfactant.

In one or more embodiments, the polishing composition comprises Hitachi HS-8005, Hitachi HS-8103GPE, and deionized water. Preferably, the Hitachi HS-8005, Hitachi HS-8103GPE, and deionized water are present in a ratio of from about 1:2.2:0 to about 1:7:2. The "0" in 1:2.2:0 reflects that no deionized water is present in a composition having a 1:2.2:0 ratio of Hitachi HS-8005, Hitachi HS-8103GPE, and deionized water.

In another embodiment, the polishing composition comprises Hitachi HS-8005, Hitachi HS-8102GP, and deionized water. Preferably, the Hitachi HS-8005, Hitachi HS-8102GP, and deionized water are present in a ratio of from about 1:2.2:0 to about 1:7:2.

In yet another embodiment, the polishing composition comprises an abrasive selected from the group consisting of alumina and ceria, a polymeric surfactant, and an oxidizing agent. Preferably, in any or all of the embodiments of compositions comprising an oxidizing agent described herein, the oxidizing agent is or includes hydrogen peroxide. While the presence of an oxidizing agent was not found to affect the amount of dishing when compositions comprising ceria were used, surprisingly, the presence of an oxidizing agent reduced dishing when compositions comprising alumina were used. It is surmised that the oxidizing agent in the presence of the surfactant and the alumina may oxidize the polysilicon, and thus render it more easily removable from the substrate.

In one aspect, the polishing composition comprises from about 1.5% to about 5% alumina, from about 1% to about 2.5% surfactant, and from about 0.3% to about 1% oxidizing agent. Preferably, the polishing composition comprises about 1.56% alumina, about 1.38% surfactant, and about 1% oxidizing agent.

In one embodiment, the polishing composition comprises Hitachi HS-8103GPE, alumina, and hydrogen peroxide. Preferably, the Hitachi HS-8103GPE, alumina, and hydrogen peroxide are present in a ratio of from about 4.4:2:1 to about 14:2:1.

In another embodiment, the polishing composition comprises Hitachi HS-8102GP, alumina, and hydrogen peroxide. Preferably, the Hitachi HS-8102GP, alumina, and hydrogen peroxide are present in a ratio of from about 4.4:2:1 to about 14:2:1.

Returning to step 330, the substrate and the polishing pad are contacted with any of the compositions described herein. In one embodiment, the polysilicon is removed at a higher removal rate than the oxide substrate surface. A removal rate ratio, or selectivity, of the polysilicon to the oxide of about 2:1 may be achieved by the use of the compositions described herein. The removal rate ratio can be monitored using lasers, since polysilicon and oxide have different reflectivities.

Preferably, a pressure between about 2 psi and about 4 psi between the substrate and the polishing pad is used to provide mechanical activity to the polishing process. Preferably, the platen speed and the head speed of the CMP tool used, such as the Mirra® Chemical Mechanical Polisher, are between about 47 and about 63 rpm and between about 43 and about 59 rpm, respectively. Of course, the platen speed and head speed are typically chosen such that there is not a large difference between the two speeds, and the speeds may vary depending on the CMP tool used.

Dishing is typically minimal using the compositions and processes described in embodiments of the invention. For example, dishing of about 200 Å to about 800 Å is typically expected. The polishing compositions and methods described herein can be used to remove polysilicon from a substrate having a polysilicon layer disposed on an oxide layer defining trenches in the substrate and field areas on the substrate. Preferably, the polishing compositions and methods described herein remove polysilicon from the fields of a substrate at a higher removal rate than from the trenches of a substrate, thereby minimizing dishing.

EXAMPLE

A polishing composition comprising 1.56% alumina, 1.38% HS-8103GPE, and 1% hydrogen peroxide (30%) was delivered to an IC1010 polishing pad on a Mirra® Chemical Mechanical Polisher. A substrate, having a polysilicon layer disposed on an oxide layer, was contacted with the pad and composition. A polishing speed of 53 rpm was used for the platen and a polishing speed of 47 rpm was used for the head. The substrate was polished for between about 150 and about 200 seconds. A substrate polished according to this process using a pressure of about 2 psi had about 440 Å of dishing, and a substrate polished according to this process using a pressure of about 4 psi had about 450 Å of dishing. The amount of dishing was estimated by subtracting the amount of polysilicon in a trench of the substrate after polishing from the desired thickness of polysilicon in the trench, e.g., a thickness of polysilicon that fills the trench.

While the foregoing is directed to embodiments of the present invention, other and further embodiments of the invention may be devised without departing from the basic scope thereof, and the scope thereof is determined by the claims that follow.

What is claimed is:

1. A method of processing a substrate, comprising:
   polishing the substrate having a polysilicon layer disposed on an oxide layer, the oxide layer forming fields and trenches in the substrate, with a polishing composition comprising a polymeric surfactant, an oxidizing agent, and an abrasive selected from the group consisting of alumina and ceria.

2. The method of claim 1, wherein polishing the substrate with the polishing composition comprises removing polysilicon from the fields at a higher removal rate than from the trenches.

3. The method of claim 1, wherein the polymeric surfactant is a polycarboxylate surfactant.

4. The method of claim 1, wherein the polishing composition comprises from about 0.5 to about 5.0% ceria and from about 1 to about 2.5% polymeric surfactant.

5. The method of claim 1, wherein the polishing composition comprises about 1% ceria and about 1.6% polymeric surfactant.

6. The method of claim 1, wherein the polishing composition comprises about 5% ceria, about 3 wt % polycarboxylates, and deionized water.

7. The method of claim 6, wherein the ceria, polycarboxylates, and deionized water are present in a ratio of from about 1:2.2:0 to about 1:7:2.

8. The method of claim 1, wherein the polishing composition comprises about 5% ceria, about 2 wt % polycarboxylates, and deionized water.

9. The method of claim 8, wherein the ceria, polycarboxylates, and deionized water are present in a ratio of from about 1:2.2:0 to about 1:7:2.

10. The method of claim 1, wherein the oxidizing agent is hydrogen peroxide.

11. The method of claim 1, wherein the polishing composition comprises from about 1.5% to about 5% alumina, from about 1% to about 2.5% polymeric surfactant, and from about 0.3% to about 1% oxidizing agent.

12. The method of claim 1, wherein the polishing composition comprises about 1.56% alumina, about 1.38% polymeric surfactant, and about 1% oxidizing agent.

13. The method of claim 1, wherein the polishing composition comprises about 3 wt % polycarboxylates, alumina, and hydrogen peroxide.

14. The method of claim 13, wherein the polycarboxylates, alumina, and hydrogen peroxide are present in a ratio of from about 4.4:2:1 to about 14:2:1.

15. The method of claim 1, wherein the polishing composition comprises about 2 wt % polycarboxylates, alumina, and hydrogen peroxide.

16. The method of claim 15, wherein the polycarboxylates, alumina, and hydrogen peroxide are present in a ratio of from about 4.4:2:1 to about 14:2:1.

17. The method of claim 1, wherein the polysilicon and the oxide are removed at a removal rate ratio of the polysilicon to the oxide of about 2:1.

18. The method of claim 1, wherein the substrate is exposed to a pressure of from about 2 to about 4 psi while the substrate is contacted with the polishing composition.

19. A method of processing a substrate, comprising:
    polishing the substrate having a polysilicon layer disposed on an oxide layer with a polishing composition comprising a polymeric surfactant, an oxidizing agent, and ceria.

20. The method of claim 19, wherein the polymeric surfactant is a polycarboxylate surfactant.

21. The method of claim 19, wherein the polishing composition comprises from about 0.5 to about 5.0% ceria and from about 1 to about 2.5% polymeric surfactant.

22. A method of processing a substrate, comprising:
    polishing the substrate having a polysilicon layer disposed on an oxide layer, the oxide layer forming fields and trenches in the substrate, with a polishing composition comprising a polymeric surfactant and an abrasive selected from the group consisting of alumina and ceria, wherein removing the polysilicon from the fields is at a higher removal rate than from the trenches.

* * * * *